United States Patent [19]
Goetting et al.

[11] Patent Number: 5,617,021
[45] Date of Patent: Apr. 1, 1997

[54] HIGH SPEED POST-PROGRAMMING NET VERIFICATION METHOD

[75] Inventors: F. Erich Goetting, Cupertino; Wade K. Peterson, Campbell; David P. Schultz, San Jose, all of Calif.

[73] Assignee: Xilinx, Inc., San Jose, Calif.

[21] Appl. No.: 511,574

[22] Filed: Aug. 4, 1995

Related U.S. Application Data

[60] Continuation-in-part of Ser. No. 234,764, Apr. 28, 1994, abandoned, which is a division of Ser. No. 919,491, Jul. 23, 1992, Pat. No. 5,319,254.

[51] Int. Cl.$^6$ .................................................. G01R 31/02
[52] U.S. Cl. ........................................ 324/158.1; 324/538
[58] Field of Search .............................. 324/158.1, 537, 324/538, 555; 371/22.1, 22.2, 25.1, 22.3; 326/38, 16; 361/767

[56] References Cited

U.S. PATENT DOCUMENTS

| | | | |
|---|---|---|---|
| 3,803,483 | 4/1974 | MeMahon, Jr. ........................ | 324/538 |
| 4,241,307 | 12/1980 | Hong ...................................... | 324/555 |
| 4,467,400 | 8/1984 | Stopper ................................... | 361/767 |
| 4,812,742 | 3/1989 | Abel et al. .............................. | 324/537 |
| 5,083,083 | 1/1992 | El-Ayat et al. ........................ | 324/538 |
| 5,291,079 | 3/1994 | Goetting . | |
| 5,319,254 | 6/1994 | Goetting . | |
| 5,367,207 | 11/1994 | Goetting et al. .......................... | 326/38 |
| 5,430,735 | 7/1995 | Sauerwald et al. ..................... | 371/22.3 |

*Primary Examiner*—Ernest F. Karlsen
*Assistant Examiner*—Russell M. Kobert
*Attorney, Agent, or Firm*—Adam H. Tachner, Esq.; Edel M. Young

[57] ABSTRACT

A method and structure for verifying interconnect structure of an FPGA device after programming. In a preferred embodiment, after programming, a single wire segment on each net of a layout is pulled down to a low reference voltage. Voltage levels on all wire segments of the device are then captured and shifted out of the device for comparison to the expected values. Low voltage levels on segments expected to remain high reveal short circuit flaws. High voltage levels on segments expected to remain low reveal open circuit flaws.

18 Claims, 10 Drawing Sheets

FIG. 11

HIGH SPEED POST-PROGRAMMING NET VERIFICATION METHOD

RELATED APPLICATION INFORMATION

This is a continuation-in-part of U.S. patent application Ser. No. 08/234,764 [M-1743-4-1D] filed Apr. 28, 1994, now abandoned, which is a divisional of Ser. No. 07/919,491 [M-1743-4D] filed Jul. 23, 1992, now U.S. Pat. No. 5,319, 254. The full text of those applications is incorporated herein by reference. Co-pending and concurrently filed U.S. patent application Ser. No. 08/511,581, now pending, entitled HIGH SPEED POST-PROGRAMMING NET PACKING METHOD is incorporated herein by reference as well.

BACKGROUND OF THE INVENTION

1. Field of the Invention

The invention relates to programmable logic devices formed in integrated circuit semiconductor chips. More particularly, the invention relates to verification of logic device programming accuracy.

2. Description of the Related Art

Programmable devices are currently available in several different architectures. One type, Field-Programmable Gate Arrays (FPGAs—sometimes referred to as programmable ASICs), comprise an array of programmable logic cells which can be interconnected by programmable interconnect lines to generate complex logic functions. Several device architectures of FPGAs are available today. The various devices differ in the complexity of a single logic cell. Some manufacturers offer devices having logic cells which are quite small (fine grained architecture). Others offer devices having logic cells which are considerably larger and which handle larger functions within a single logic block (coarse grained architecture). In an FPGA device, it is possible to feed the output of any one logic cell to an input of any other logic cell, and thereby form a chain, generating a function which has multiple levels of logic. However, the efficacy of such a chain, no matter what type of logic cell is used, is directly linked to the accuracy obtained in programming interconnections between logic cells.

Another point of distinction between FPGAs is the re-programmability of the interconnect structure. The structure and content of the interconnect in an FPGA is called its routing architecture. The routing architecture consists of both wire segments and programmable switches. Programmable switches are constructed using several techniques, including: pass-transistors controlled by static RAM cells, anti-fuses, EPROM transistors, and EEPROM transistors. As with logic block designs, there are a number of differing routing architectures. Some FPGAs offer a large number of simple connections between blocks, and others provide fewer but more complex routes. While properties of these technologies differ widely, the programming switches are all configurable to one of two states: ON or OFF.

Antifuse Programming Technology

Antifuse programming technology is used by a number of FPGA manufacturers. An antifuse normally resides in a high impedance state but can be "fused" (permanently) into a low-impedance state when programmed by a high voltage difference across its terminals, thereby forming an interconnect, referred to by Xilinx, Inc. as a MicroVia™ interconnect.

Figure 4:
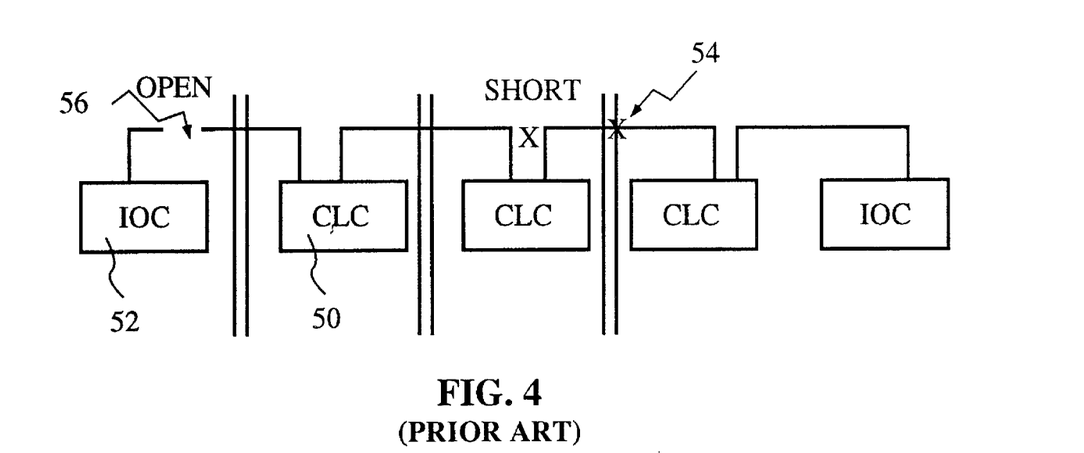
FIG. 4 illustrates a prior art configurable logic cell array layout.

FIG. 4 provides a block diagram illustrating the features of an antifuse-based programmable interconnect structure. Configurable Logic Cells (CLCs) 50 and Input/Output Cells (IOCs) 52 are connectable to a grid of horizontal and vertical interconnect wire segments. A plurality of wire segments which have been connected together to form one conductive region is called a net. Faults in programmable interconnect implementation include shorts 54 between wire segments which the programmer wishes to keep separate and open circuits 56 between wire segments which the programmer wishes to connect. Either of these flaws lead to circuit layouts which differ from the desired layout and produce device failure.

To guarantee 100 percent accuracy of antifuse-based FPGA programming, two verification processes are required. First, as on any programmable device, it is necessary to test all components for proper operation before programming. For example all transistors must be tested. All antifuses must be tested for non-conductivity in their original state. All wire segments must also be tested, both for continuity throughout their length and for shorts to adjacent wire segments. Numerous effective methods exist for such pre-programming testing.

If a manufacturer finds a pre-programming flaw in a set of devices, those devices may be pulled from distribution. However, pre-programming test methods only partially ensure manufacturing quality and do not ensure the efficacy of a programmed device implementation. The device must also be tested after programming to assure proper operation. If a flaw is not found before the programmed device is installed in a system, accessing and replacing the device can be slow and expensive. If, for instance, a device is programmed by an end user and an antifuse fails to short, or an unwanted fuse is made and the device is installed in a system before this flaw is detected, then the flaw is difficult to locate and the manufacturer may need to bear the burden of finding the flaw and replacing the device for the end user directly. The end user may be inconvenienced by the loss of a sale or the loss of use of a product dependent upon the programmable device.

Thus, the second and more demanding verification process is post-programming verification. If an effective and quick method for post-programming verification can be used in conjunction with a reliable pre-programming test, then the combination of the two tests will provide a highly reliable verification process for the antifuse-based FPGA manufacturer and user.

Available Approaches to Programming Verification

One available approach to programming verification of one-time programmable FPGAs is the generation and implementation of mandatory test vectors. A test vector comprises a set of deterministic 0's and 1's that are first input into a device, then compared with an expected output pattern. The test vector sequences play a key role in exercising the FPGA to verify whether the unit under test is functioning properly, i.e., to determine whether programming of logic blocks, input/output units and interconnect units was performed successfully.

Normally, a set of test vectors is created and stored to complement a circuit design. The test vectors are stored in a memory unit, such as a magnetic hard drive, and are then retrieved and run through a device after programming is complete.

A first disadvantage of the mandatory test vector method is low speed. If, for instance, a 16-bit combinational multiplier were implemented in a single FPGA (a fairly simple circuit layout), the total number of test vectors required to exhaustively test the programmed device and ensure 100% interconnect accuracy is over 4.3 billion (2 to the 32nd power). With available computing power and speed, such an exhaustive test conducted at a common testing speed of 1 MHZ would take over 71 minutes. Even at the highly accelerated rate of 10 MHZ, the test would take 7 minutes to complete. The need for improvement is especially apparent in high volume production and programming of FPGAs, where testing delay is expensive and can provide a disincentive for testing every device, instead relying only on random testing of a representative sample. Moreover, as the device complexity increases, a similar increase in the number of test vectors is often required as well to ensure proper device operation.

Second, the amount of memory required to store test vectors can be substantial and costly. For example, the 4.3 billion vectors required for a 16-bit combinational multiplier would require 34 gigabytes of storage space. Accessing such a tremendous volume of data also contributes to the amount of time required for mandatory test vector implementation.

Figure 3:
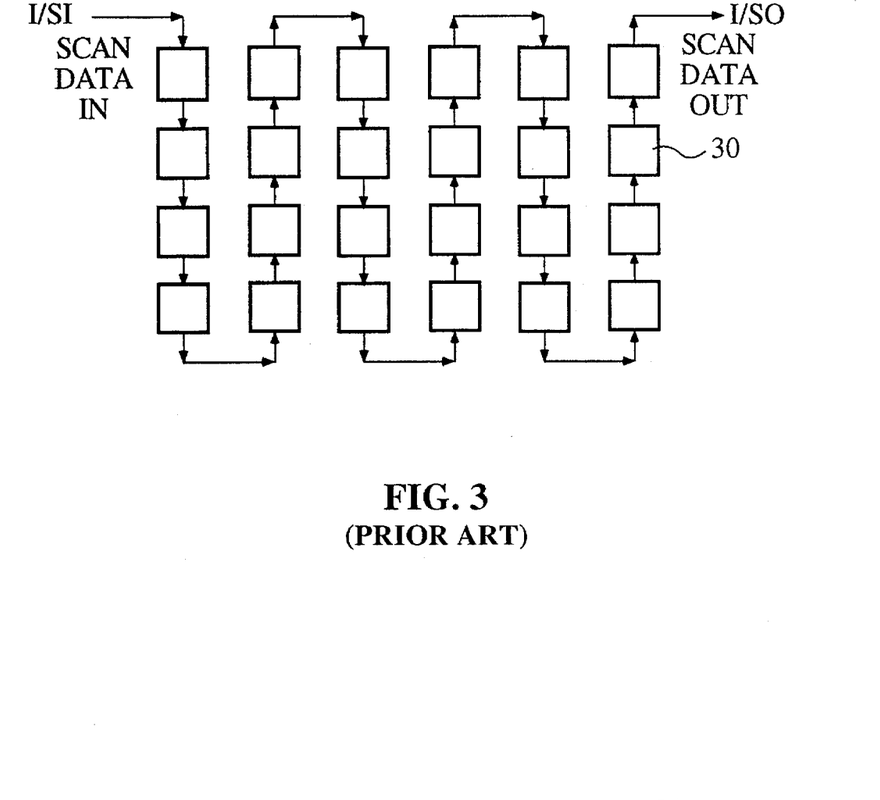
FIG. 3 illustrates a prior art scan-path testing verification approach.

One improvement found in some existing FPGAs for easing the test vector based post-programming process is the use of a built-in, serial scan-path, illustrated in FIG. 3, linking registers 30 to one another in order to more efficiently pass test results (scan data) to the user. It should be noted that FIG. 3 does not illustrate either a programmed interconnect or programmable logic. Scan-path testing often allows the use of smaller vector sets than otherwise needed. However, because scan-path testing reduces the number of test vectors only if the chip design is flip-flop dependent, scan-path testing often fails to reduce the burden of reliably testing combinational logic and programmed interconnect. For instance, in the above-referenced 16-bit combinational multiplier, scan-path testing would have no effect. Moreover, vast storage space is still required for vector implementation and the time involved in a complete test of every device remains prohibitive for the large-volume producer. Scan-path testing techniques require the dedication of a number of valuable I/O pins in the FPGA package which may be better used for other purposes after the testing procedure is complete.

Instead of providing every possible combination of signals, for example, every combination of numbers to be multiplied, it is possible to provide a smaller set of test vectors which still tests every gate in the hardware for proper operation. Automatic test pattern generation (ATPG) software is available for this purpose. ATPG may produce a far smaller set of test vectors, but can be monetarily expensive to acquire and computationally expensive to use. Some users are willing to accept a device in which less than 100% of the gates have been tested. Sometimes even if the number of vectors used for testing generates a less-than-100% test, the test can still be prohibitively time consuming.

As a further incentive to simplifying the testing procedure, programmed FPGAs are most conveniently tested by the FPGA user who programs the FPGA and installs it in a system board, not by the FPGA manufacturer. A tester which stores and applies a large set of test vectors at high speed might cost on the order of $100,000. A user typically can not afford a tester which will cost so much.

CCU-Based Antifuse Status Access

In one type of antifuse-based FPGA architecture, described by Goetting in U.S. Pat. No. 5,291,079, every potential interconnect includes a configuration control unit (CCU) which controls the programming of the antifuse interconnect structure and captures array status, information which can be used for testing the array or debugging a design. The CCUs are connected together into a shift register.

After all or a set of antifuses are programmed, configuration information is shifted into the CCUs to establish the configuration of the cells. These same CCUs can be used to capture the logical states of each of the interconnect wire segments, each CCU capturing one signal present on an interconnect wire segment to which that CCU connects.

While most antifuse-based FPGA architectures do not include CCUs for directly accessing the status of interconnect points, there is a need among all one-time programmable architectures for a reliable and fast method of verifying the accuracy of programmed interconnect. If a flaw is not found before the device is installed in a system, accessing and replacing the device can be slow and expensive. It is therefore preferable to ensure programming accuracy just after programming, using the same hardware with which the interconnect was programmed. The present invention provides a high speed, easy to use, post-programming verification method.

SUMMARY OF THE INVENTION

The present invention requires no vector storage space, is therefore less expensive than existing post-programming verification techniques, and accelerates the testing process to allow testing of every programmed device, even in a high-volume production environment. Test equipment for implementing the present invention can be obtained for a few hundreds of dollars, and is therefore affordable to FPGA users for in-the-field testing.

It is therefore an object of the present invention to provide a programmable logic interconnect verification method which is fast and thorough and does not require the dedication of a significant portion of the available logic on any given FPGA device for effective performance.

A further object of the present invention is to provide a method of verifying the connection layout of an array of conducting segments and programmable interconnects on an integrated circuit, such as a field programmable gate array, by altering the voltage level at one interconnect segment to a selected level, measuring the voltage levels at a plurality of segments, and verifying the accuracy of the connection layout by comparing the voltage levels at the plurality of segments to a set of voltage levels representing a desired connection layout for the plurality of segments.

The present invention includes the use of a basic testing element tied to each wire segment within a layout. By precharging all wire segments within the layout, pulling down the voltage on a single wire segment within a known net, accessing the status of all wire segments within the layout after the pull down operation, and verifying that all wire segments within the layout are in the expected states, successful programming of the device can be verified. If and only if all of the wire segments in the same net as a pulled down wire segment are also pulled down, then the formation of that net is successful. If unanticipated wire segments not in the net also pull down, then a short (unintentionally fused antifuse) is indicated. If a wire segment within the net which should pull down remains high, then an open circuit (unintentionally unfused antifuse) is indicated. The test may be performed once for every net in the desired layout to ensure complete programming accuracy.

BRIEF DESCRIPTION OF THE DRAWINGS

FIG. 8, which comprises

DETAILED DESCRIPTION OF THE PREFERRED EMBODIMENT

The present invention provides a method for quickly and thoroughly verifying implemented logic cell interconnections, preferably in the context of an antifuse-based architecture. A preferred embodiment of the present invention exploits characteristics of a configuration control unit, or CCU, as defined by Goetting in U.S. Pat. No. 5,291,079 which is incorporated herein by reference.

Figure 1:
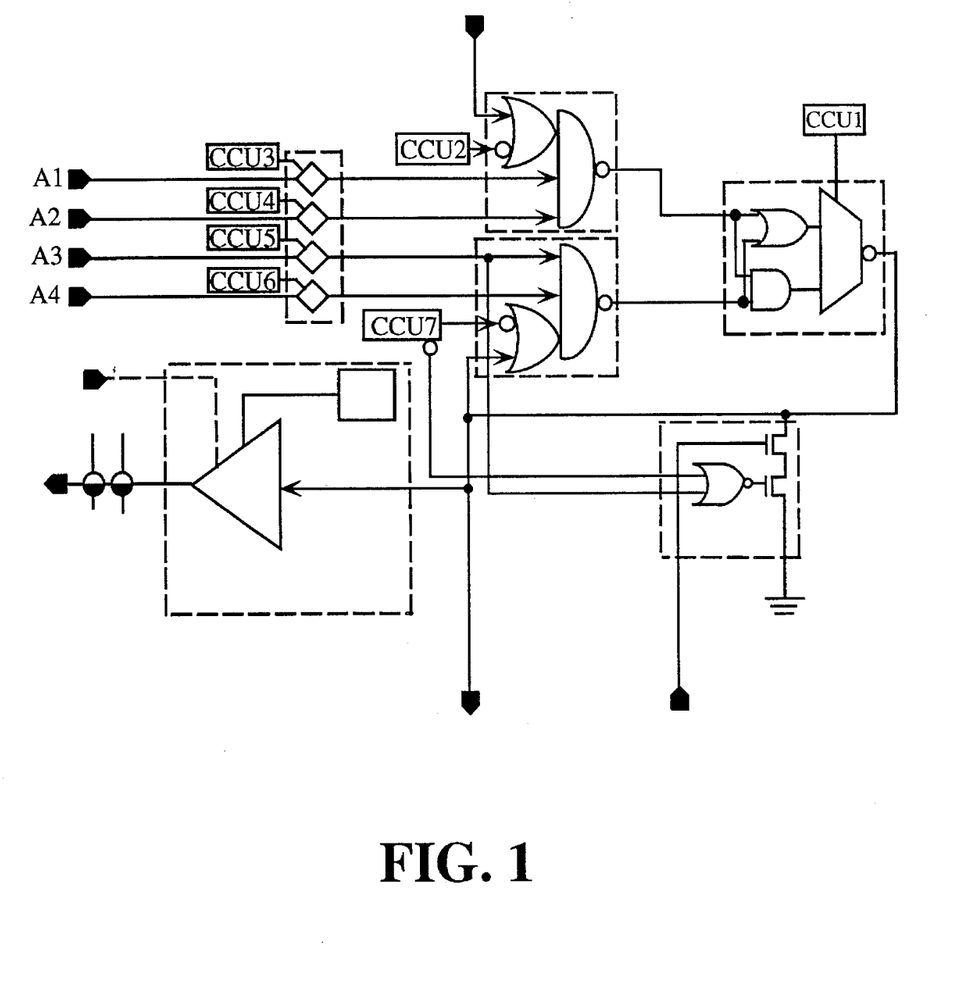
FIG. 1 shows a logic cell on which a preferred method of practicing the present invention might be performed.

FIG. 1 illustrates the use of CCUs in a logic cell. CCU1 through CCU7 are used for three purposes: first for applying programming voltages to antifuses in the interconnect structure, second for storing configuration information which configures the cell during normal operation, and third for allowing a user to capture the status of all signals on interconnect wire segments and shift these out of the chip to be examined by the user. The method of the present invention exploits at least two of these CCU capabilities: applying programming voltages to antifuses, and allowing a user to capture status of interconnect wire segments. However, any other device or method for controlling and accessing interconnect wire segment signals may be used to practice the method and structure of the present invention.

Figure 2:
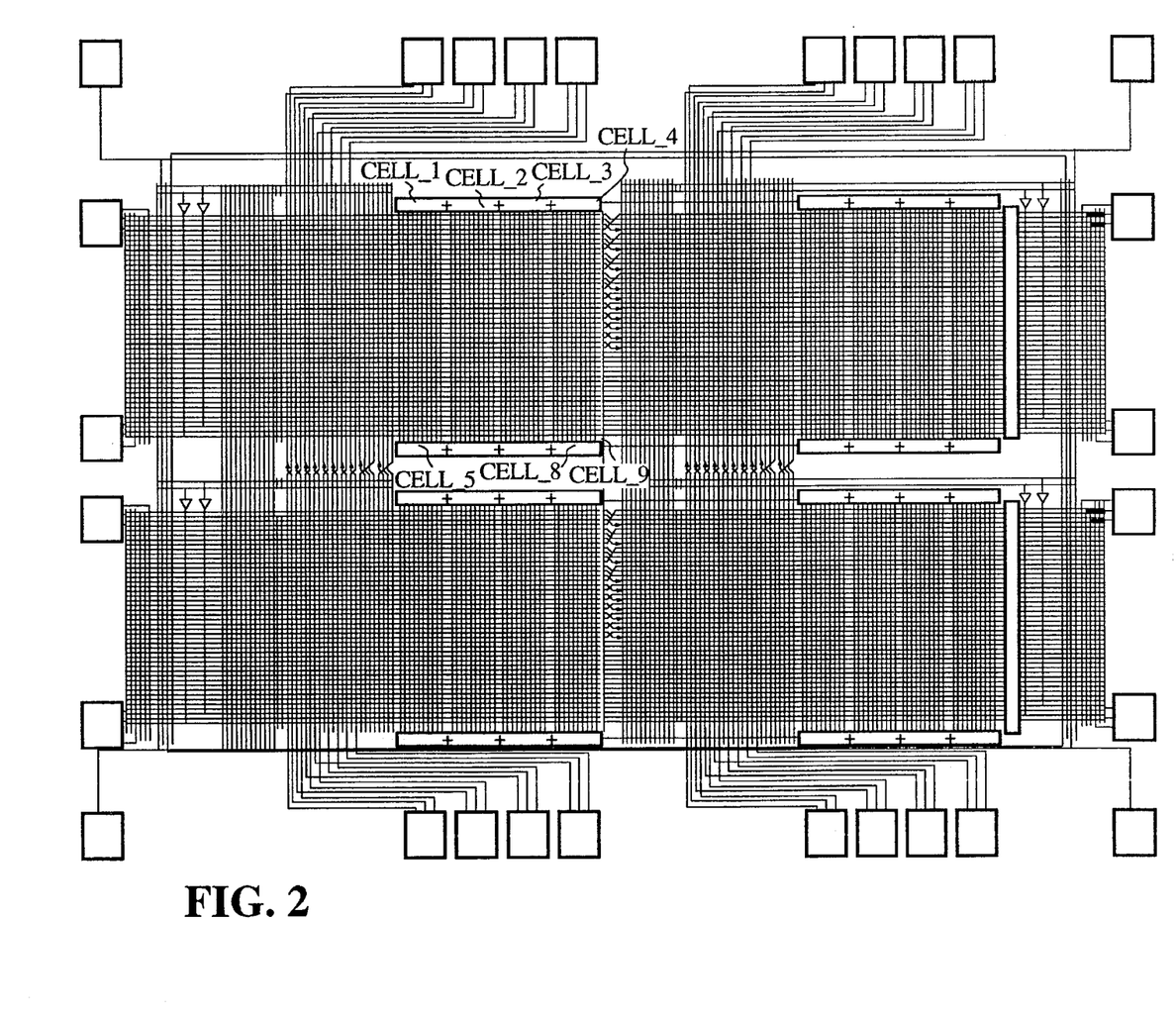
FIG. 2 shows a very small field programmable integrated circuit device made up of the cells of FIG. 1.

As shown in FIG. 2, in one possible FPGA layout, logic cells are grouped into blocks of eight cells CELL_1 through CELL_8 with a ninth cell CELL_9 comprising a plurality of CCUs. The nine cells of a block combine with an antifuse interconnect structure (antifuses are represented by black dots) which can be programmed to interconnect the cells to each other to implement a circuit design desired by a user. Four cell blocks are shown in FIG. 2. A typical integrated circuit array will comprise 100 to 1000 of these cell blocks such as shown in FIG. 2, plus peripheral I/O circuitry, clock oscillators, and other overhead circuitry usually positioned along the perimeter of the cell.

Figure 9:
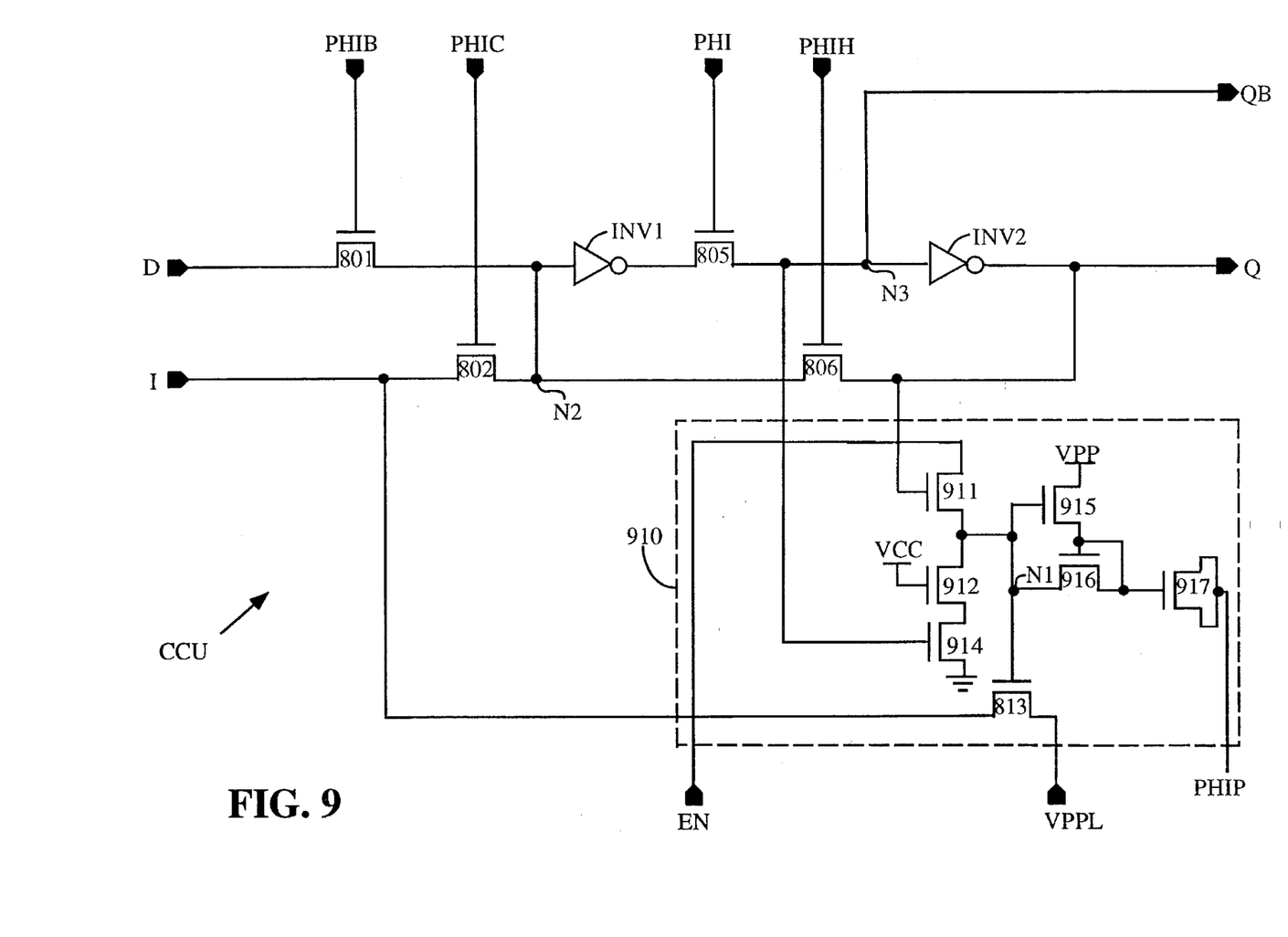
FIG. 9 shows an implementation of the configuration control units such as CCU1 through CCU7 of FIGS. 1 and 2.

FIG. 9 shows a CCU such as CCU1 through CCU7 of FIG. 1. One function of the CCU of FIG. 9 is to capture the signal present on that wire segment to which the CCU is connected. The CCUs can allow a user to examine the signal on each wire segment which is connected to a CCU. And every wire segment in the interconnect structure is in fact connected to a CCU.

Programming Antifuses

Configuration of a chip entails configuration of cells to perform a desired function and of the interconnect structure to interconnect the cells to each other as desired. The method and structure of the present invention are directed to the interconnect programming structure. This structure is interconnected by programming (making conductive) selected antifuses to connect selected horizontal interconnect wire segments to selected vertical interconnect wire segments.

Figure 11:
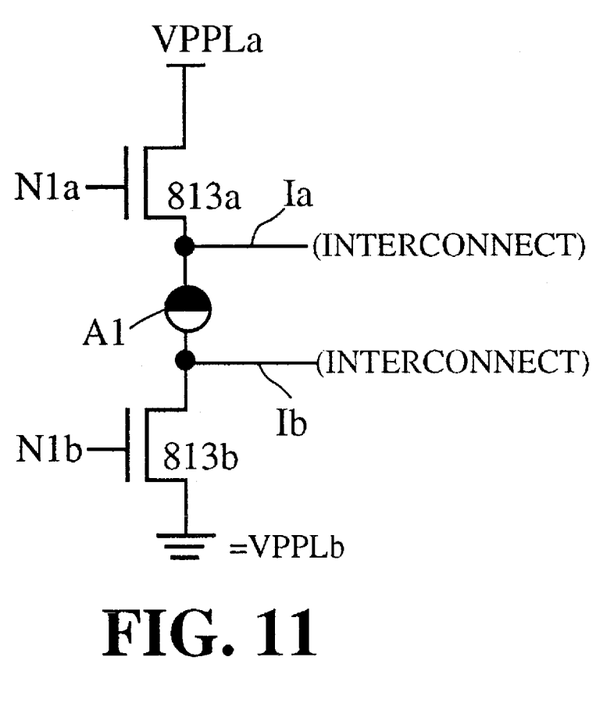
FIG. 11 represents an antifuse programming structure used in an array such as shown in FIG. 2, which uses logic cells such as shown in FIG. 1.

An antifuse is programmed by applying two sufficiently different programming voltages to one horizontal wire segment and one vertical wire segment intersecting at the antifuse. FIG. 11 shows a simplified representation of the antifuse programming path created by two circuits shown in FIG. 9. The skilled artisan will understand that the two wire segments need not necessarily be perpendicular to one another to practice the known antifuse programming technique. When two different CCUs apply sufficiently different values of VPPL to their respective interconnect wire segments I, the voltage difference applied across an antifuse in the interconnect structure is sufficient to program the antifuse. That voltage difference, for example 10 volts, is sufficient to program antifuse A1 in FIG. 11.

The above process of applying the programming voltage difference is repeated for every antifuse to be programmed.

Programming Errors

Figure 5:
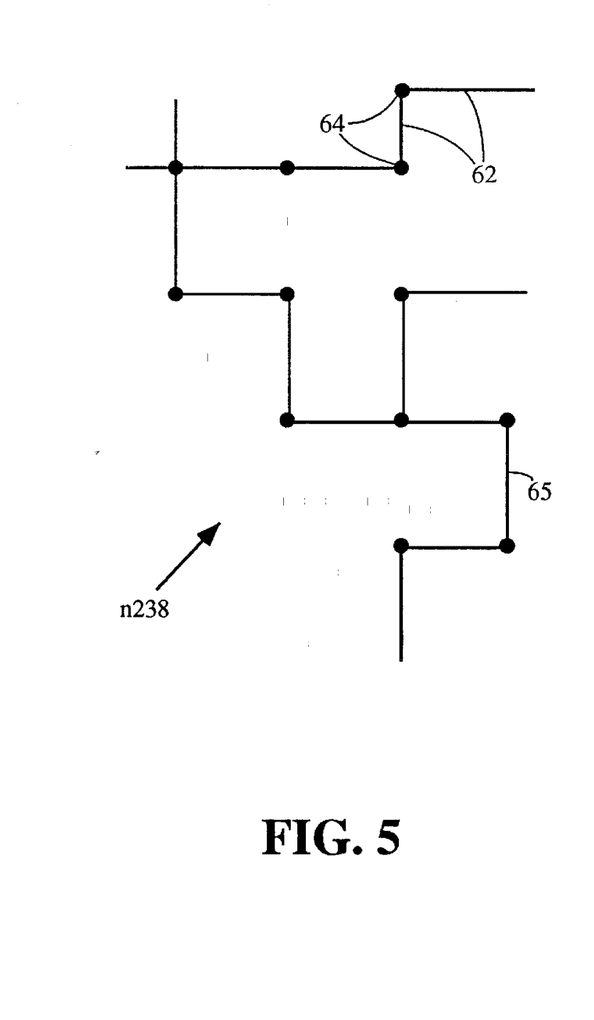
FIG. 5 represents an interconnect wire segment and antifuse structure connected to form a net.
Figure 6:
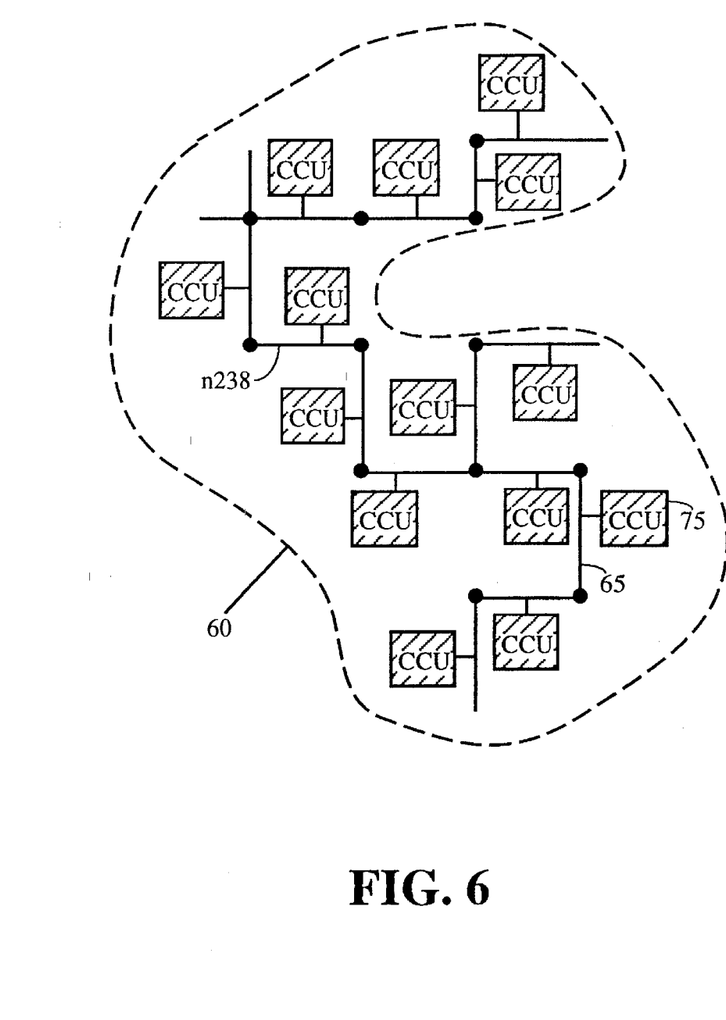
FIG. 6 shows the structure of FIG. 5 along with configuration control units (CCUs) attached to each wire segment in the net.
Figure 7:
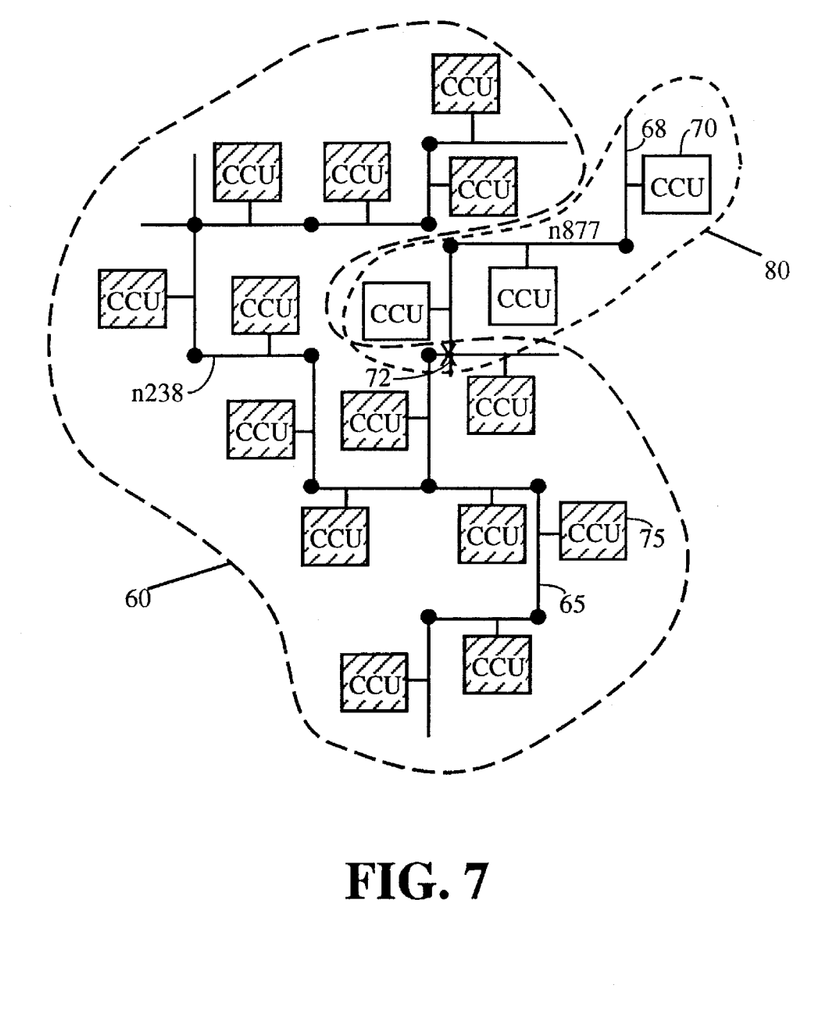
FIG. 7 represents two nets and a short between them.

FIGS. 5, 6 and 7 illustrate an error which can arise in antifuse-based programming of a net n238. Net n238 includes a group of wire segments 62 connecting configurable logic cells (not shown). Wire segments 62 have been interconnected by antifuses 64 during programming to form net n238. FIG. 6 shows net testing group 60 comprising net n238 along with one CCU for every wire segment 62 within net n238. FIG. 7 shows two nets n238 and n877 and their related net testing groups 60 and 80, respectively. CCUs in net group 60 are shaded and CCUs in net group 80 are white. If nets n238 and n877 are functioning properly, pulling down one wire segment in net n238 should cause all wire segments in net n238 to pull down and should not cause any wire segments in net n877 to pull down. However, FIG. 7 shows that a short at point 72 has undesirably connected nets n238 and n877 together so that when a wire segment in net n238 is pulled down, the verification test of the present invention will show that all CCUs in net group 60 carry logic 0 values upon readout but that CCUs in net group 80 also erroneously carry logic 0.

In FIG. 7, for example, if an undesired connection were created at point 72, the undesired connection can be detected by pulling down any wire segment on net n238 and loading values on all wire segments into their associated CCUs (for example loading the value on wire segment 68 into CCU70 and loading the value on wire segment 65 back into CCU75), and reading the resultant values from all CCUs.

Testing Steps

Four steps are performed to test proper operation of the programmed nets in the device.

1. All wire segments are precharged to a high voltage.

2. One wire segment on a net is pulled down to a low voltage.

3. Logic levels on all wire segments are captured in their respective CCUs.

4. Values captured in the CCUs are shifted out and compared to expected values.

Precharging

To ensure accurate results after pulling down the test wire, all wire segments in the device must be precharged high to provide the necessary contrast to the voltage level at the pulled down net. Precharging can be done using any technique known to those skilled in the relevant art. After precharging, the wires are then left in a dynamic floating state, subject to the effects of, for example, a nearby short to a pulled down net.

Pulling Down a Wire Segment

Next, a single wire segment on a net is pulled down to a low voltage level by loading a logical 1 into a CCU connected to that wire. Application of the pulldown voltage to wire segment 62 is controlled from the CCU circuit of FIG. 9. By applying high signals PHI and PHIB to all transistors 801 and 805 in the shift register, and applying logical 0 to the D input of the first cell in the shift register, the entire shift register is set so that all Q outputs are logical 0 and all $\overline{Q}$ outputs are logical 1. Next, a token logical 1 bit is shifted through the register by alternately turning on transistors 801 and 805 with non-overlapping high signals PHIB and PHI. During this shifting operation, low signals on PHIC and PHIH maintain transistors 802 and 806 off. When the token has been shifted into position, a low signal PHIB holds transistor 801 off, while high signals PHI and PHIH latch the token into the CCU in a static latch configuration, inverters INV1 and INV2 being connected together through transistors 805 and 806 into a static RAM cell. The token is then available to drive the appropriate wire segment.

After a logical 1 token is loaded through the shift register into the CCU, the global signal EN is brought high, which applies voltage to the source of N-channel transistor 911 and allows a high voltage on the Q output terminal to turn on transistor 911. The EN voltage is applied to all CCUs in the chip. Thus all circuits 910 are enabled. All CCUs except those related to the interconnect wire segment to be pulled down carry a logical 0, or low voltage, so most transistors 813 will remain off when the Q output voltage is applied to the gate of transistor 813. For the CCU storing a logical 1, the high voltage provided by transistor 911 to the gate of 813 turns on transistor 813, causing the low VPPL voltage to be applied to the interconnect wire segment I.

The CCU in the embodiment of FIG. 9 employs a charge pump consisting of transistors 915, 916, and 917 (configured as a capacitor). An oscillating waveform on signal PHIP serves to inject charge onto node N1. The voltage on node N1 reacts to this charge injection and to the states of transistors 911, 912, and 914 which are controlled by the EN, Q and $\overline{Q}$ signals. This charge pump is described in U.S. Pat. No. 5,319,254 incorporated by reference. However, the charge pump is not necessary for proper operation of the net verification structure and method of the present invention. In another embodiment, no charge pump comprising transistors 915, 916, and 917 is provided, and the gate of transistor 813 is simply controlled from the node between transistors 911 and 912. As outlined in Table I, only when Q and EN are both logical 1 is N1 brought high or allowed to charge up. As shown in Table 1, when Q and EN are both high, N1 charges to VCC–Vt. At this time, PHIP is not switching and therefore the charge pump comprising transistors 915, 916, and 917 is not pumping. (In other operations using the CCU of FIG. 9, the pump is operating, and in this situation the voltage on N1 can charge to VPP+Vt.)

TABLE I

| Q/$\overline{Q}$ | EN | 911 | 912 | 914 | N1 | 813 |
|---|---|---|---|---|---|---|
| 0/1 | 0 | off | on | on | held to ground by 914, 912 | off |
| 1/0 | 0 | on | on | off | held to ground by 911 | off |
| 0/1 | 1 | off | on | on | held to ground by 914, 912 | off |
| 1/0 | 1 | off | on | off | driven to VCC-Vt through 911 | on |

Recall that at this point a low voltage has been applied to one wire segment of a net, and if all connections are proper the low voltage appears on the entire net and not on wire segments of other nets.

Interconnect Signal Capture

After a single interconnect wire segment is brought down via a CCU, it is necessary to examine the signals present on the interconnect wire segments throughout the chip. Collectively the CCUs of an array are formed as one or a few shift registers. The CCUs can shift out information which has been captured from the interconnect wire segments. Thus, the CCUs can allow a user to examine the signal on each wire segment which is connected to a CCU. And every wire segment in the interconnect structure is in fact connected to a CCU.

Figure 8A:
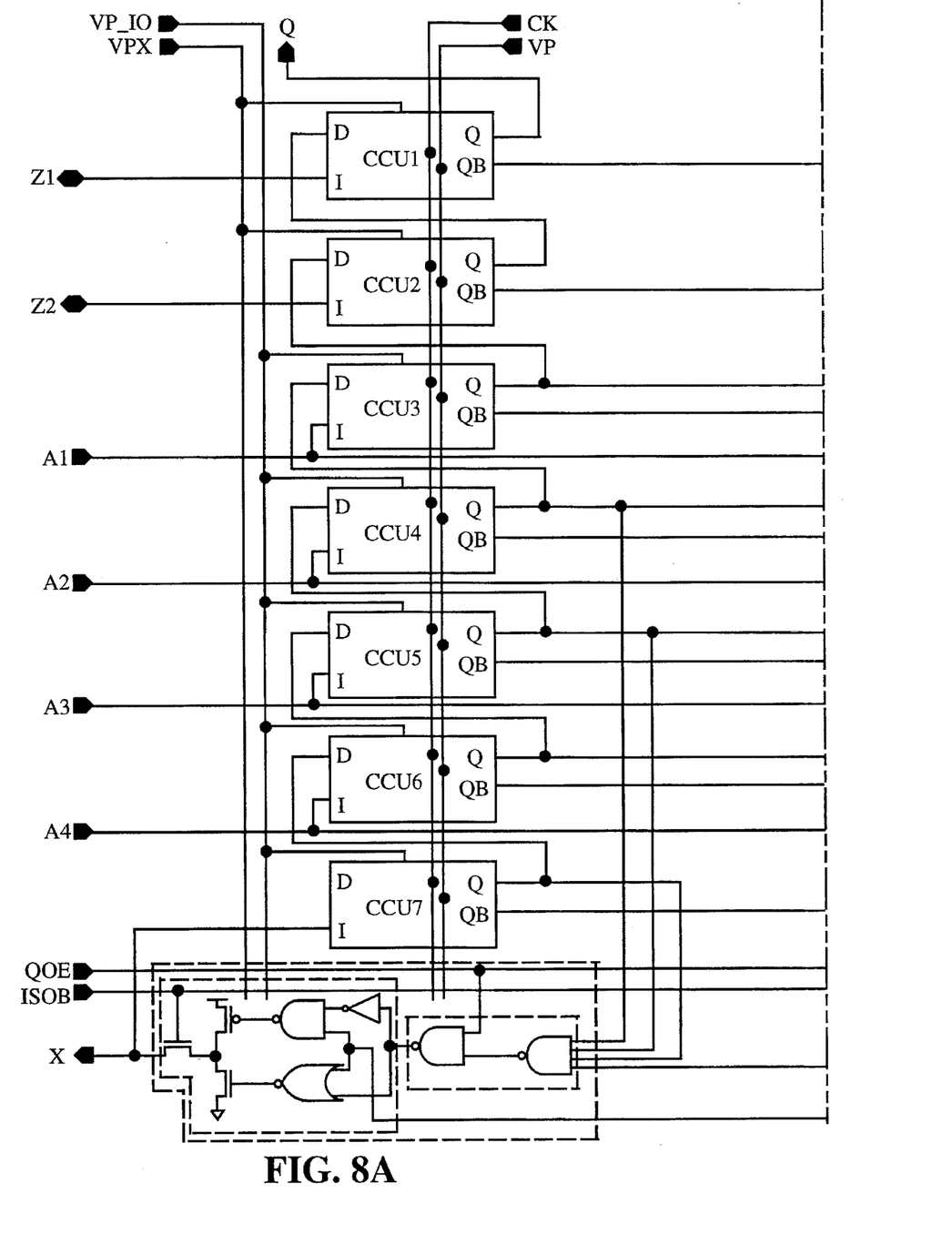
FIGS. 8A and 8B, shows an embodiment of the cell of FIG. 1 including the configuration control units which configure the cell.
Figure 8B:
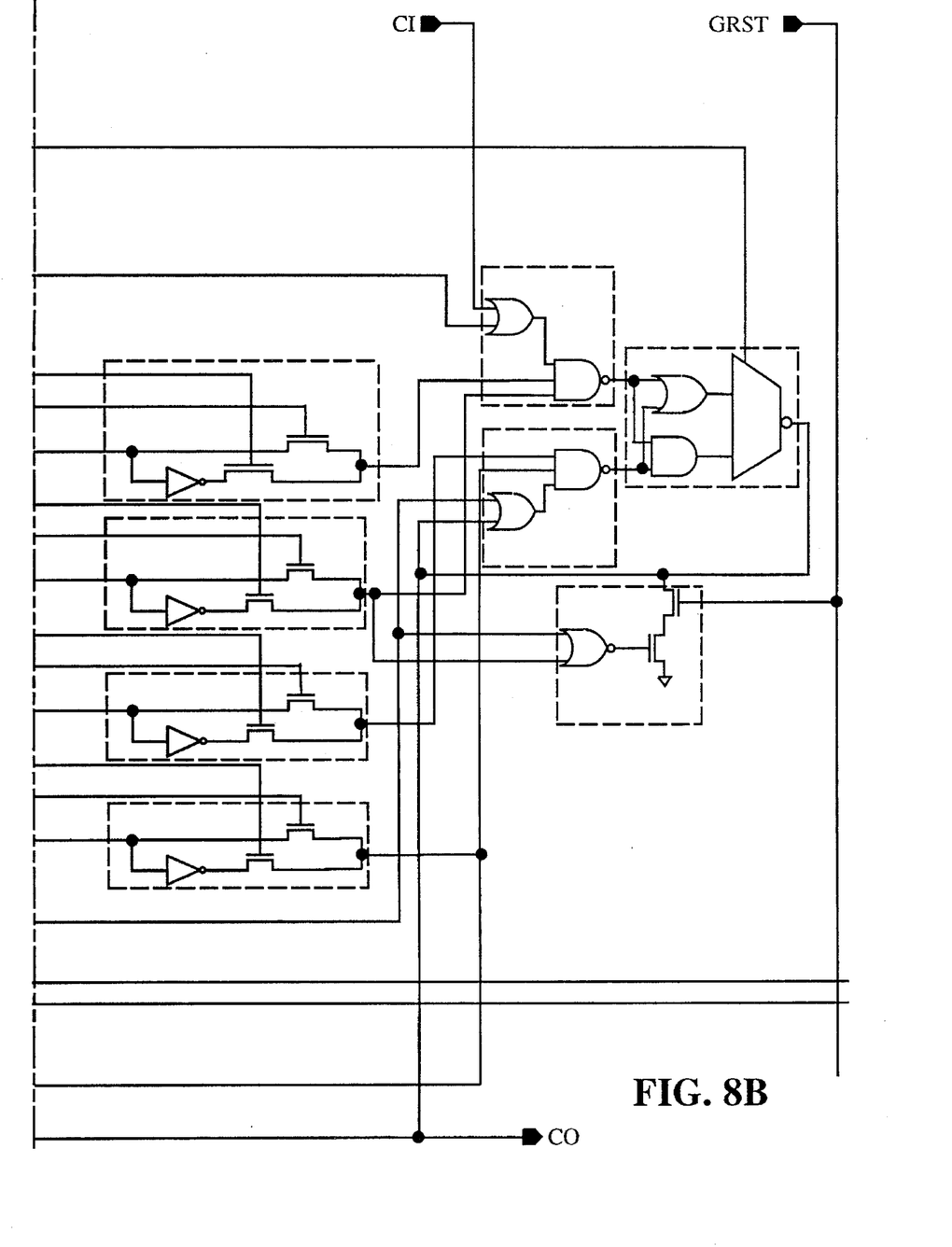

FIG. 8, comprising FIGS. 8A and 8B, shows one embodiment of the FIG. 1 cell in which the present invention may operate. Elements of FIG. 8 which correspond to elements of FIG. 1 are given the same reference numerals. Looking at FIG. 8A, signals Z1, Z2, X, and A1 through A4 are all input signals to the seven CCUs depicted, and are taken from the interconnect wire segments such as wire segments 65 and 68 of FIG. 7.

The following sequence of steps allows the interconnect wire segment data to be transferred into the CCUs. This sequence of steps allows the value on wire segment I of FIG. 9 to be substituted for the value which has been stored by INV1 and INV2 in the CCU.

Timing Diagram

Figure 10:
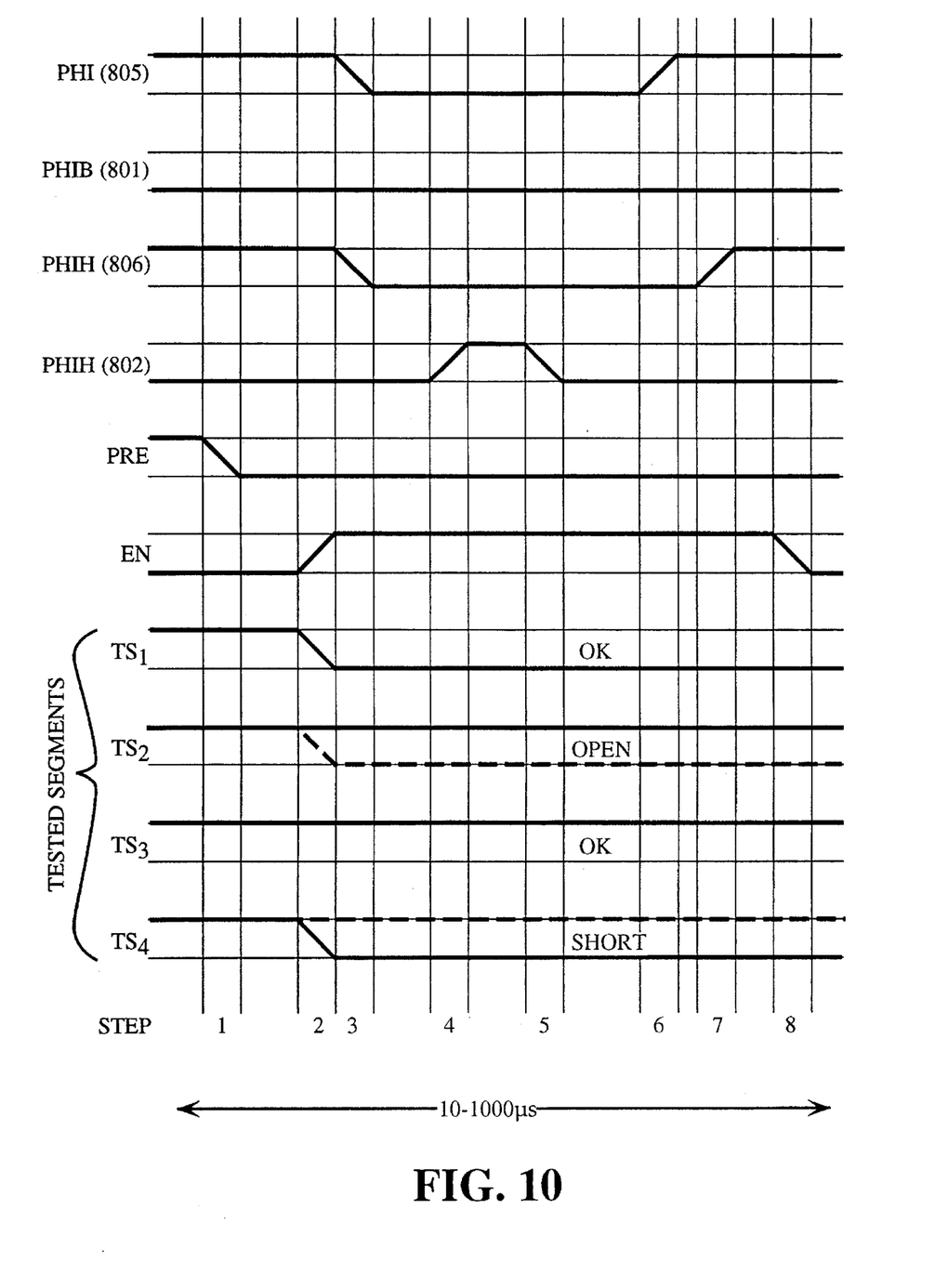
FIG. 10 shows a timing diagram when the circuit of FIG. 9 is used with the method of the present invention.

FIG. 10 shows a timing diagram of a preferred order of controlling signals PHI, PHIH, PHIB, and PHIC in order to reliably apply a test signal to a wire segment and capture signals from interconnect wire segments I into respective CCUs without causing loss of data or contention in any parts of the array. Throughout the testing process, all configurable cell output drivers are held in a high impedance state to avoid contention. Steps 1 through 8 in FIG. 10 are as follows:

1. Before step 1, all wire segments are precharged to logic 1. At step 1, as signified by the drop in the PRE signal, the transistors supplying the precharge voltage are deactivated so that all wire segments are floating at a logic 1 value.

2. At step 2, the EN signal is brought high to activate all CCUs and pull down the selected wire segment. Four tested segments are illustrated in FIG. 10. Tested segments $TS_1$ and $TS_2$ are on the net having the wire segment pulled low, while tested segments $TS_3$ and $TS_4$ are on other nets different from the net having the wire segment pulled low. As shown in FIG. 10, tested segment $TS_1$ properly goes low at step 2, while tested segment $TS_2$, which should have gone low, remains high because of a failed connection. Tested segment $TS_3$, on another net, properly does not go low, and tested segment $TS_4$, also on another net, improperly goes low because of a short.

3. At step 3, the PHI and PHIH signals are brought low, turning off transistors 805 and 806, so the CCU is temporarily put into a dynamic memory state (that is, a state in which the values will only be retained temporarily on node N3). Capacitance is such that the value can be retained on the order of a millisecond, and the preferred timing is such that the cell will be held in its dynamic state on the order of 1 microsecond.

4. At step 4, transistor 802 is turned on with a high PHIC signal, so that the signal on interconnect wire segment I (which can represent interconnect segments A1 through A4, X, Z1, and Z2 in FIG. 8A) is applied to node N2 and inverter INV1. Since transistor 806 is off, there is no contention between the dynamic signal on node N2 being applied to inverter INV1 and the signal Q which is still dynamically (temporarily) stored on node N3 in the CCU.

5. At step 5, once the signal is captured on node N2, PHIC is brought low, turning off transistor 802. The state of signal I is now stored dynamically on node N2.

6. At step 6, signal PHI is brought high, turning on transistor 805, and thus the captured I signal (inverted) is applied to node N3 and INV2. The signal Q temporarily stored at step 3 above is now overwritten with the value that was present on the wire segment.

7. At step 7, PHIH is brought high, turning on transistor 806, and latching the signal which was on I into the static memory cell formed by INV1, 805, INV2 and 806.

8. Finally, at step 8, enable signal EN is brought low, completing the data gathering phase of testing.

At this point, the CCUs of the array contain the signals present on their respective interconnect wire segments. Since the CCUs can be connected into a shift register configuration (part of which is illustrated in FIG. 8A), the signals may be shifted out and analyzed. (For further discussion of shifting out these signals, see U.S. Pat. No. 5,319,254 which has been incorporated herein by reference.) Segments on a net which have been properly connected to the test wire segment, in this case test segment $TS_1$, will have been pulled down and thus their corresponding CCU values will be low. Any segments on a tested net which did not pull down with the test wire segment, such as $TS_2$, will cause their corresponding CCUs to carry logic 1 signals and reveal an open circuit within the net. Similarly, properly disjoint segments ($TS_3$) will not have pulled down with the test wire segment. If any segments outside the tested net ($TS_4$) have pulled down with the test wire segment, a short circuit connecting the tested net to some other net or to an unused wire segment on the device has occurred. These results are revealed when the CCU values are shifted out.

Any of these error types may preclude the proper functioning of a programmed device. An open circuit within a net or a short connecting two distinct nets will usually lead to a complete failure of the device to perform a desired function. A short circuit to a segment intended to be left unused may lead to intolerable timing problems and possibly to failure to perform the desired design function. In order to provide a safety margin, a conservative test will indicate failure even if the device might operate properly under many conditions.

Swift capture of test data immediately after the test wire is pulled down plays an important role in test accuracy. Leakage current across unprogrammed antifuses is not uncommon with available devices. Moreover, leakage between nets should be expected. In the preferred embodiment of the present invention, data is captured for analysis within a few dozen microseconds after pull down of the test wire is complete.

The process of loading the shift register, applying the pull down voltage and capturing the interconnect wire segment signal across the device is performed for a single interconnect wire segment on each net of the device. If each net test were to take 100 ms, a complete test of a 16-bit combination multiplier comprised of 1,288 nets would take on the order of 2 minutes. This short test time (relative to available techniques) is accomplished without using significant memory space for storing a large set of test vectors.

While the present invention has been described with reference to certain preferred embodiments, those skilled in the art will recognize that various modifications and other embodiments may be provided. These other embodiments are intended to fall within the scope of the present invention. For example, any means for accessing and checking the status of an interconnect wire segment which is compatible with the constraints of FPGA design may be used in place of the preferred CCU. These and other variations upon and modifications to the embodiment described herein are provided for by the present invention which is limited only by the following claims.

What is claimed is:

1. A method of verifying the connection layout of an array of conducting segments and programmable interconnects on an integrated circuit after the circuit is programmed in accordance with a desired layout, said method comprising the steps of:

programming a selected set of said programmable interconnects to connect selected ones of said conducting segments;

altering the voltage level at a first of said selected ones of said conducting segments to a selected level;

measuring the voltage levels at a selected plurality of said selected ones of said conducting segments;

verifying the accuracy of the connection layout by comparing the voltage levels at said plurality of said selected ones of said conducting segments to a set of voltage levels representing a desired connection layout for said selected plurality of said selected ones of said conducting segments.

2. The method of claim 1, further comprising the step of adjusting the voltage level at said plurality of said selected ones of said conducting segments to provide a contrast to said selected voltage level at said first of said selected ones of said conducting segments.

3. The method of claim 1, wherein said altering step comprises reducing the voltage level at said first of said selected ones of said conducting segments to below a selected threshold level.

4. The method of claim 1, wherein said altering step comprises increasing the voltage level at said first of said selected ones of said conducting segments to above a selected threshold level.

5. The method of claim 1, further comprising the step of providing a plurality of monitoring units, each of said monitoring units electrically connected to a corresponding one of said plurality of said selected ones of said conducting segments.

6. The method of claim 5, wherein said monitoring units comprise configuration control units (CCUs) which comprise:
- memory means which may be loaded and read, said memory means providing a stored value; and
- means for controlling application of a testing voltage to a corresponding interconnect wire segment, comprising:
  - means for supplying a testing voltage to said corresponding interconnect wire segment;
  - means for controlling said means for supplying;
- whereby when said stored value is a selected voltage, and said means for controlling selects said stored value, said means for supplying a testing voltage supplies said testing voltage to said corresponding interconnect wire segment.

7. The method of claim 1, wherein said integrated circuit comprises a field programmable gate array.

8. The method of claim 1, wherein said programmable interconnects comprise antifuses.

9. The method of claim 1, wherein any two of said programmable interconnects are separated by at least one of said conducting segments.

10. A structure for verifying the connection layout of an array of conducting segments and programmable interconnects on an integrated circuit after the circuit is programmed in accordance with a desired layout, said circuit comprising:
- means for altering the voltage level at a first of said conducting segments to a selected voltage level;
- means for measuring the voltage levels at a plurality of said conducting segments;
- means for verifying the accuracy of the connection layout by comparing the voltage levels at said plurality of conducting segments to a set of voltage levels representing the desired connection layout for said plurality of conducting segments.

11. The structure of claim 10, further comprising means for adjusting the voltage level at said plurality of conducting segments to provide a contrast to said selected voltage level at said first of said conducting segments.

12. The structure of claim 10, wherein said means for altering comprises means for reducing the voltage level at said first of said conducting segments to below a selected threshold level.

13. The structure of claim 10, wherein said means for altering comprises means for increasing the voltage level at said first of said conducting segments to above a selected threshold level.

14. The structure of claim 10, further comprising means for providing a plurality of monitoring units, each of said monitoring units electrically connected to a corresponding one of said plurality of conducting segments.

15. The structure of claim 14, wherein said monitoring units comprise configuration control units (CCUs) which comprise:
- memory means which may be loaded and read, said memory means providing a stored value; and
- means for controlling application of a testing voltage to a corresponding interconnect wire segment, comprising:
  - means for supplying a testing voltage to said corresponding interconnect wire segment;
  - means for controlling said means for supplying;
- whereby when said stored value is a selected voltage, and said means for controlling selects said stored value, said means for supplying a testing voltage supplies said testing voltage to said corresponding interconnect wire segment.

16. The structure of claim 10, wherein said integrated circuit comprises a field programmable gate array.

17. The structure of claim 10, wherein said programmable interconnects comprise antifuses.

18. The structure of claim 10, wherein any two of said programmable interconnects are separated by at least one of said conducting segments.

* * * * *